(12) United States Patent
Choung et al.

(10) Patent No.: US 11,456,345 B1
(45) Date of Patent: *Sep. 27, 2022

(54) CONDUCTIVE OXIDE OVERHANG STRUCTURES FOR OLED DEVICES

(71) Applicant: Applied Materials, Inc., Santa Clara, CA (US)

(72) Inventors: Ji-young Choung, Hwaseong-si (KR); Chung-Chia Chen, Hsinchu (TW); Yu Hsin Lin, Zhubei (TW); Jungmin Lee, Santa Clara, CA (US); Dieter Haas, San Jose, CA (US); Si Kyoung Kim, Gwangju-si (KR)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/662,960

(22) Filed: May 11, 2022

Related U.S. Application Data

(63) Continuation of application No. 17/647,214, filed on Jan. 6, 2022, now Pat. No. 11,348,983, which is a
(Continued)

(51) Int. Cl.
*H01L 27/32* (2006.01)
*H01L 51/00* (2006.01)
*H01L 51/52* (2006.01)

(52) U.S. Cl.
CPC ...... *H01L 27/3246* (2013.01); *H01L 51/0008* (2013.01); *H01L 51/5237* (2013.01); *H01L 2251/308* (2013.01)

(58) Field of Classification Search
CPC ............. H01L 27/3246; H01L 51/0008; H01L 51/5237; H01L 2251/308
(Continued)

(56) References Cited

U.S. PATENT DOCUMENTS

2004/0180457 A1 9/2004 Bimstosk et al.
2012/0217516 A1* 8/2012 Hatano ................. H01L 51/525
257/E33.062
(Continued)

FOREIGN PATENT DOCUMENTS

CN 106449726 B 4/2019
CN 109873023 A 6/2019

OTHER PUBLICATIONS

International Search Report/Written Opinion issued to PCT/US2022/022191 dated Jul. 21, 2022.

*Primary Examiner* — Xia L Cross
(74) *Attorney, Agent, or Firm* — Patterson + Sheridan, LLP

(57) ABSTRACT

Sub-pixel circuits and methods of forming sub-pixel circuits that may be utilized in an organic light-emitting diode (OLED) display are described herein. The overhang structures are permanent to the sub-pixel circuit. The overhang structures include a conductive oxide. A first configuration of the overhang structures includes a base portion and a top portion with the top portion disposed on the base portion. In a first sub-configuration, the base portion includes the conductive oxide of at least one of a TCO material or a TMO material. In a second sub-configuration, the base portion includes a metal alloy material and the conductive oxide of a metal oxide surface. A second configuration of the overhang structures includes the base portion and the top portion with a body portion disposed between the base portion and the top portion. The body portion includes the metal alloy body and the metal oxide surface.

25 Claims, 14 Drawing Sheets

Related U.S. Application Data continuation of application No. 17/389,934, filed on Jul. 30, 2021.

(60) Provisional application No. 63/179,074, filed on Apr. 23, 2021.

(58) Field of Classification Search
 USPC .......................................................... 257/506
 See application file for complete search history.

(56) References Cited

U.S. PATENT DOCUMENTS

| | | | |
|---|---|---|---|
| 2014/0008642 A1* | 1/2014 | Morita | C09D 11/50 438/46 |
| 2016/0308162 A1 | 10/2016 | Yoo et al. | |
| 2018/0108842 A1 | 4/2018 | Li et al. | |
| 2019/0088730 A1 | 3/2019 | Lee et al. | |
| 2020/0312930 A1 | 10/2020 | Choi et al. | |

* cited by examiner

US 11,456,345 B1

CONDUCTIVE OXIDE OVERHANG STRUCTURES FOR OLED DEVICES

CROSS-REFERENCE TO RELATED APPLICATIONS

This application is a continuation application which claims priority to U.S. patent application Ser. No. 17/647,214, filed Jan. 26, 2022 which is a continuation of patent application Ser. No. 17/389,934, filed Jul. 30, 2021, which claims benefit of U.S. Patent Application No. 63/179,074, filed on Apr. 23, 2021, the contents of which are herein incorporated by reference.

BACKGROUND

Field

Embodiments described herein generally relate to a display. More specifically, embodiments described herein relate to sub-pixel circuits and methods of forming sub-pixel circuits that may be utilized in a display such as an organic light-emitting diode (OLED) display.

Description of the Related Art

Input devices including display devices may be used in a variety of electronic systems. An organic light-emitting diode (OLED) is a light-emitting diode (LED) in which the emissive electroluminescent layer is a film of an organic compound that emits light in response to an electric current. OLED devices are classified as bottom emission devices if light emitted passes through the transparent or semi-transparent bottom electrode and substrate on which the panel was manufactured. Top emission devices are classified based on whether or not the light emitted from the OLED device exits through the lid that is added following the fabrication of the device. OLEDs are used to create display devices in many electronics today. Today's electronics manufacturers are pushing these display devices to shrink in size while providing higher resolution than just a few years ago.

OLED pixel patterning is currently based on a process that restricts panel size, pixel resolution, and substrate size. Rather than utilizing a fine metal mask, photo lithography should be used to pattern pixels. Currently, OLED pixel patterning requires lifting off organic material after the patterning process. When lifted off, the organic material leaves behind a particle issue that disrupts OLED performance. Accordingly, what is needed in the art are sub-pixel circuits and methods of forming sub-pixel circuits to increase pixel-per-inch and provide improved OLED performance.

SUMMARY

In one embodiment, a device is provided. The device includes a substrate, adjacent pixel-defining layer (PDL) structures disposed over the substrate and defining sub-pixels of the device, overhang structures including a conductive oxide, the overhang structures disposed over an upper surface of the PDL structures, and a plurality of sub-pixels. Each sub-pixel including an anode, an organic light-emitting diode (OLED) material disposed over and in contact with the anode, and a cathode disposed over the OLED material, the conductive oxide overhang structures disposed over the upper surface of the PDL structures extend over a portion of the OLED material and the cathode.

In another embodiment, a device is provided. The device includes a plurality of sub-pixels, each sub-pixel of the plurality of sub-pixels defined by adjacent pixel-defining layer (PDL) structures with overhang structures disposed over the PDL structures, each sub-pixel having an anode, organic light-emitting diode (OLED) material disposed on the anode, and a cathode disposed over the OLED material, the overhang structures including a conductive oxide. The device is made by a process including depositing the OLED material using evaporation deposition over a substrate, the OLED material disposed over and in contact with the anode, the OLED material having an OLED edge defined by defined by adjacent overhangs of the conductive oxide overhang structures, and depositing the cathode using evaporation deposition, the overhang structures disposed over the PDL structure extend over a portion of the OLED material and the cathode, the overhang structures including the conductive oxide.

In another embodiment, a method is provided. The method includes disposing an overhang layer stack over adjacent pixel defining layer (PDL) structures, each sub-pixel of a plurality of sub-pixels is defined by the adjacent PDL structures. The overhang layer stack includes at least a base layer and top layer disposed over the base layer. The base layer includes at least one of a transparent conductive oxide (TCO) material, a transition metal oxide (TMO) material, or a metal alloy material. The method includes disposing a resist layer over the overhang layer stack and patterning the resist layer to form pixel openings in the resist layer, etching the overhang layer stack exposed by the pixel openings to form overhang structures having a top portion corresponding to the top layer and at least a base portion corresponding to the base layer, and depositing an organic light-emitting diode (OLED) material and a cathode using evaporation deposition such that the cathode contacts at least a portion of the base portion.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 1A:
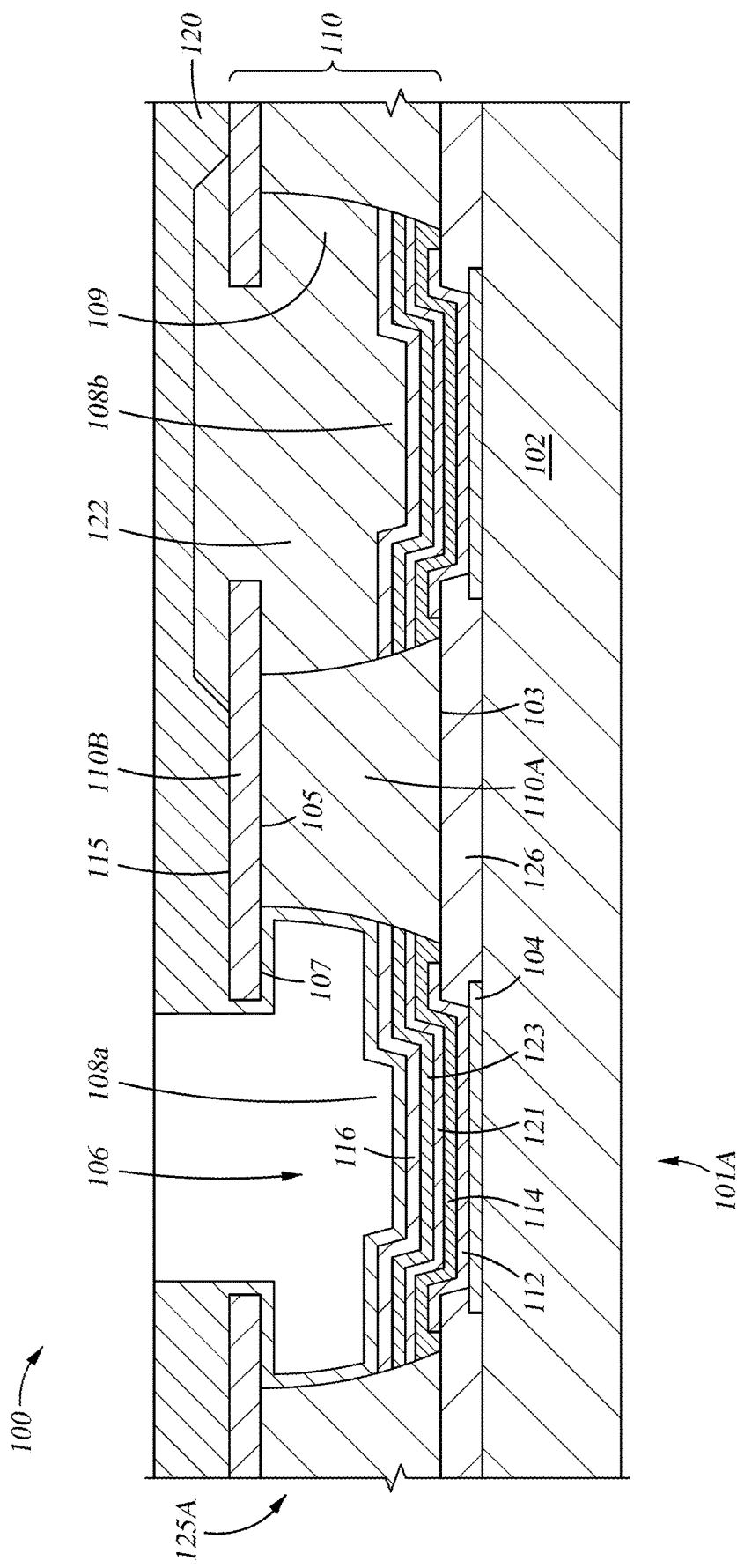
FIGS. 1A and 1B are schematic, cross-sectional views of a sub-pixel circuit according to embodiments.

Embodiments described herein generally relate to a display. More specifically, embodiments described herein relate to sub-pixel circuits and methods of forming sub-pixel circuits that may be utilized in a display such as an organic light-emitting diode (OLED) display. In one embodiment, which can be combined with other embodiments described herein, the display is a bottom emission (BE) or a top emission (TE) OLED display. In another embodiment, which can be combined with other embodiments described herein, the display is a passive-matrix (PM) or an active matrix (AM) OLED display.

A first exemplary embodiment of the embodiments described herein includes a sub-pixel circuit having a dot-type architecture. A second exemplary embodiment of the embodiments described herein includes a sub-pixel circuit having a line-type architecture. A third exemplary embodiment of the embodiments described herein includes a sub-pixel circuit having a dot-type architecture with a plug disposed on an encapsulation layer of a respective sub-pixel. A fourth exemplary embodiment of the embodiments described herein includes a sub-pixel circuit having a line-type architecture with a plug disposed on an encapsulation layer of a respective sub-pixel.

Each of the embodiments described herein of the sub-pixel circuit include a plurality of sub-pixels with each of the sub-pixels defined by adjacent overhang structures that are permanent to the sub-pixel circuit. The overhang structures include a conductive oxide. While the Figures depict two sub-pixels with each sub-pixel defined by adjacent overhang structures, the sub-pixel circuit of the embodiments described herein include a plurality of sub-pixels, such as two or more sub-pixels. Each sub-pixel has the OLED material configured to emit a white, red, green, blue or other color light when energized. E.g., the OLED material of a first sub-pixel emits a red light when energized, the OLED material of a second sub-pixel emits a green light when energized, and the OLED material of a third sub-pixel emits a blue light when energized.

The overhang structures are permanent to the sub-pixel circuit. The overhang structures include a conductive oxide. A first configuration of the overhang structures includes a base portion and a top portion with the top portion disposed on the base portion. In a first sub-configuration, the base portion includes the conductive oxide of at least one of a transparent conductive oxide (TCO) material or a transition metal oxide (TMO) material. The TCO material includes, but is not limited to, one or more of indium zinc oxide (IZO), indium gallium zinc oxide (IGZO), indium tin oxide (ITO), or combinations thereof. The TMO material includes a transition metal. The transition metal is any element whose atom has a partially filed d sub-shell, or which can give rise to cations with an incomplete d sub-shell. Examples of the transition metal includes, but are not limited to, one or more of oxides of ruthenium (Ru), vanadium (V), titanium (Ti), zinc (Zn), copper (Cu), molybdenum (Mo), or combinations thereof. In a second sub-configuration, the base portion includes a metal alloy material and the conductive oxide of a metal oxide surface. The metal alloy material incudes, but is not limited to, copper (Cu), Ti, aluminum (Al), molybdenum (Mo), silver (Ag), tin (Sn) or combinations thereof. The metal oxide surface includes one or more oxides of the metal alloy material.

A second configuration of the overhang structures includes the base portion and the top portion with a body portion disposed between the base portion and the top portion. The base portion includes the conductive oxide of at least one of the TCO material or the TMO material. The body portion includes the metal alloy body and the metal oxide surface. The metal alloy body includes the metal alloy material. The top portion includes a metal material that includes, but is not limited to, Ti, Cu, Mo, ITO, IZO, or combinations thereof.

The adjacent overhang structures defining each sub-pixel of the sub-pixel circuit of the display provide for formation of the sub-pixel circuit using evaporation deposition and provide for the overhang structures to remain in place after the sub-pixel circuit is formed. Evaporation deposition may be utilized for deposition of an OLED material (including a hole injection layer (HIL), a hole transport layer (HTL), an emissive layer (EML), and an electron transport layer (ETL)) and cathode. One or more of an encapsulation layer, the plug, and a global encapsulation layer may be disposed via evaporation deposition. The overhang structures extend over a portion of the OLED material and the cathode of the sub-pixels. The overhang structures define deposition angles, i.e., provide for a shadowing effect during evaporation deposition, for each of the OLED material and the cathode such the OLED material does not contact the overhang structures and the cathode contacts at least a portion of a sidewall of the base portion of the overhang structures.

The encapsulation layer of a respective sub-pixel is disposed over the cathode with the encapsulation layer. The encapsulation layer may be or may correspond to a local encapsulation layer. The encapsulation layer may extend under at least a portion of each of the adjacent overhang structures. In other embodiments, which can be combined with other embodiments described herein, the encapsulation layer may further extend along a sidewall of each of the adjacent overhang structures. The encapsulation layer may also be disposed over or on an upper surface of the top portion of the overhang structures. A global encapsulation layer may be disposed over the encapsulation layer. The plug of the third and the fourth exemplary embodiments may be disposed between the encapsulation layer and the global encapsulation layer. In one example, the global encapsulation layer is conformal to the cathode and the overhang structures. In another example, the global encapsulation layer is non-conformal to the cathode and the overhang structures. The global encapsulation layer may include an inkjet sublayer and a global encapsulation sublayer.

Figure 1B:
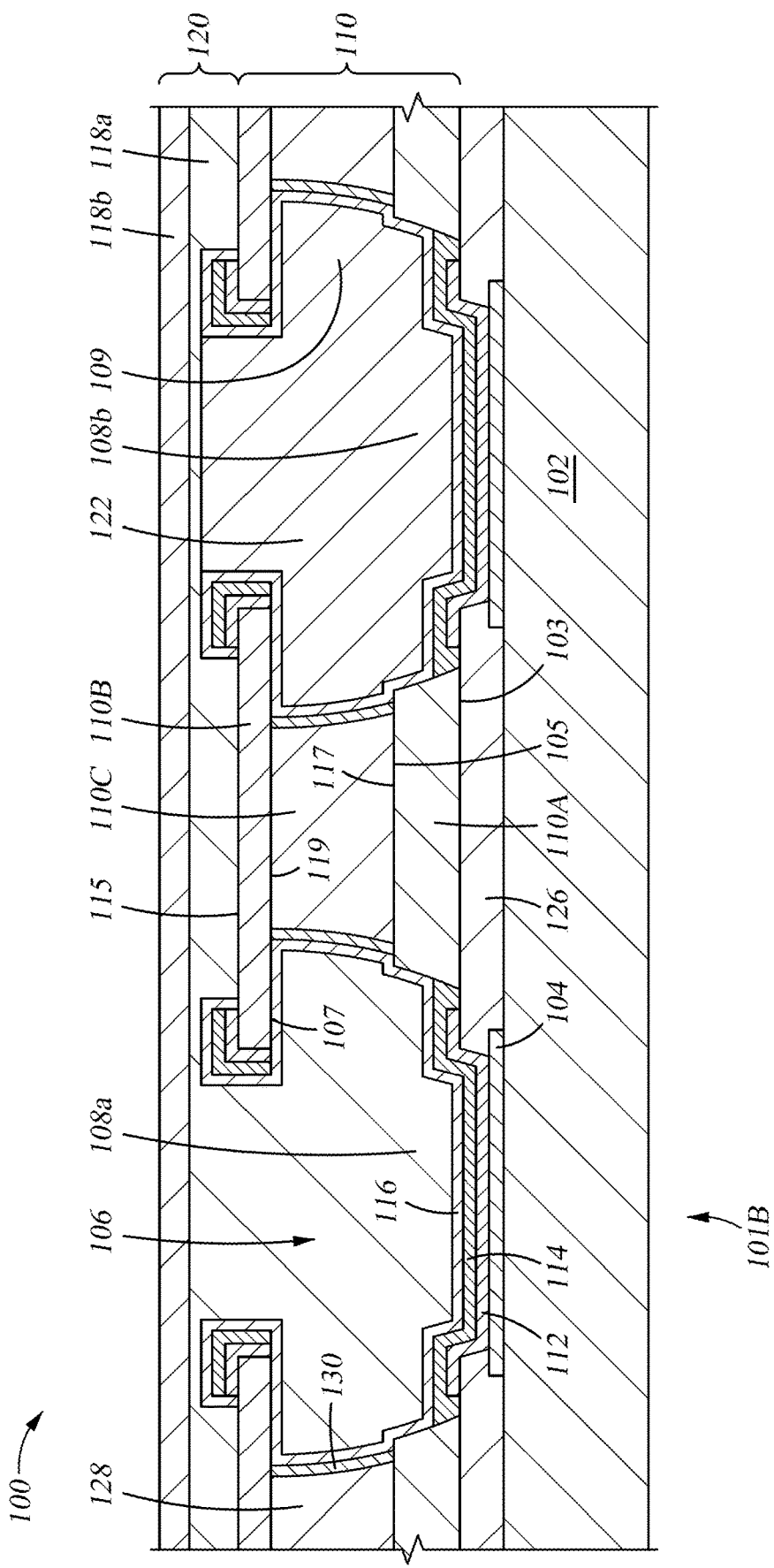

FIGS. 1A and 1B are schematic, cross-sectional views of a sub-pixel circuit 100. The sub-pixel circuit 100 of FIG. 1A includes the first configuration 101A of overhang structures 110. The overhang structures 110 include a conductive oxide. The first configuration 101A of the overhang structures 110 includes a base portion 110A and a top portion 110B with the top portion 110B disposed on the base portion 110A. The sub-pixel circuit 100 of FIG. 1B includes the second configuration 101B of the overhang structures. The second configuration 101B of the overhang structures 110 includes the base portion 110A and the top portion 110B with a body portion 110C disposed between the base portion and the top portion.

The sub-pixel circuit 100 includes a substrate 102. Metal layers 104 may be patterned on the substrate 102 and are defined by adjacent pixel-defining layer (PDL) structures 126 disposed on the substrate 102. In one embodiment, which can be combined other embodiments described herein, the metal layers 104 are pre-patterned on the substrate 102. E.g., the substrate 102 is a pre-patterned indium tin oxide (ITO) glass substrate. The metal layers 104 are configured to operate anodes of respective sub-pixels. The metal layers 104 include, but are not limited to, chromium, titanium, gold, silver, copper, aluminum, ITO, or combinations thereof, or other suitably conductive materials.

The PDL structures 126 are disposed on the substrate 102. The PDL structures 126 include one of an organic material, an organic material with an inorganic coating disposed thereover, or an inorganic material. The organic material of the PDL structures 126 includes, but is not limited to, polyimides. The inorganic material of the PDL structures 126 includes, but is not limited to, silicon oxide ($SiO_2$), silicon nitride ($Si_3N_4$), silicon oxynitride (SiON), magnesium fluoride ($MgF_2$), or combinations thereof. Adjacent PDL structures 126 define a respective sub-pixel and expose the anode (i.e., metal layer 104) of the respective sub-pixel of the sub-pixel circuit 100.

The sub-pixel circuit 100 has a plurality of sub-pixels 106 including at least a first sub-pixel 108*a* and a second sub-pixel 108*b*. While the Figures depict the first sub-pixel 108*a* and the second sub-pixel 108*b*. The sub-pixel circuit 100 of the embodiments described herein may include two or more sub-pixels 106, such as a third and a fourth sub-pixel. Each sub-pixel 106 has an OLED material 112 configured to emit a white, red, green, blue or other color light when energized. E.g., the OLED material 112 of the first sub-pixel 108*a* emits a red light when energized, the OLED material of the second sub-pixel 108*b* emits a green light when energized, the OLED material of a third sub-pixel emits a blue light when energized, and the OLED material of a fourth sub-pixel emits a other color light when energized The overhang structures 110 are disposed on an upper surface 103 of each of the PDL structures 126. The overhang structures 110 are permanent to the sub-pixel circuit. Thus, organic material from lifted off overhang structures that disrupt OLED performance would not be left behind. Eliminating the need for a lift-off procedure also increases throughput. The overhang structures 110 further define each sub-pixel 106 of the sub-pixel circuit 100. The overhang structures 110 include at least (e.g., the first configuration 101A) the base portion 110A disposed on the upper surface 103 of each of the PDL structures 126 and the top portion 110B disposed over the base portion 110A. At least an underside surface 107 of the top portion 110B is wider than a top surface 105 of the base portion 110A to form an overhang 109. The body portion 110C of second configuration 101B of the overhang structures 110 includes at a bottom surface 117 with a width less than or equal to the top surface 105 of the base portion 110A, and a top surface 119 with a width less than the underside surface 107 of the top portion 110B.

The underside surface 107 of the top portion 110B larger than the top surface 105 of the base portion 110A forming the overhang 109 allows for the top portion 110B to shadow the base portion 110A. The shadowing of the overhang 109 provides for evaporation deposition each of the OLED material 112 and a cathode 114. As further discussed in the corresponding descriptions of FIGS. 2A and 2B, the shadowing effect of the overhang structures 110 define a OLED angle $\theta_{OLED}$ (shown in FIGS. 2A and 2B) of the OLED material 112 and a cathode angle $\theta_{cathode}$ (shown in FIGS. 2A and 2B) of the cathode 114. The OLED angle $\theta_{OLED}$ of the OLED material 112 and the cathode angle $\theta_{cathode}$ of the cathode 114 may result from evaporation deposition of the OLED material 112 and the cathode 114.

In a first sub-configuration 125A of the first configuration 101A of the overhang structures 110, as shown in FIG. 1A, the base portion 110A includes a conductive oxide of at least one of the TCO material or the TMO material. The TCO material includes, but is not limited to, one or more of IZO, IGZO, ITO, or combinations thereof. The TMO material includes a transition metal. The transition metal is any element whose atom has a partially filed d sub-shell, or which can give rise to cations with an incomplete d sub-shell. Examples of the TMO material include, but are not limited to, one or more of oxides of Ru, V, Ti, Zn, Cu, Mo, or combinations thereof. In a second sub-configuration 125B of the first configuration 101A of the overhang structures 110, as shown in FIG. 2B, the base portion 110A includes a metal alloy material and the conductive oxide of a metal oxide surface 130. The metal alloy material that incudes, but is not limited to, Cu, Ti, Al, Mo, Ag, Sn or combinations thereof. The metal oxide surface 130 includes one or more oxides of the metal alloy material. A second configuration 101B of the overhang structures 110, the body portion 110C includes a metal alloy body 128 with a metal oxide surface 130. The metal alloy body 128 includes the metal alloy material. The top portion 110B includes a metal material that includes, but is not limited to, Ti, Cu, Mo, ITO, IZO or combinations thereof.

The OLED material 112 may include one or more of a HIL, a HTL, an EML, and an ETL. The OLED material 112 is disposed on the metal layer 104. In some embodiments, which can be combined with other embodiments described herein, the OLED material 112 is disposed on the metal layer 104 and over a portion of the PDL structures 126. The cathode 114 is disposed over the OLED material 112 of the PDL structures 126 in each sub-pixel 106. The cathode 114 is be disposed on a portion of a sidewall 111 of the base portion 110A. The cathode 114 includes a conductive material, such as a metal. E.g., the cathode 114 includes, but is not limited to, chromium, Ti, Al, ITO, or a combination thereof. In some embodiments, as shown in FIG. 1B, which can be combined with other embodiments described herein, at least one of the OLED material 112 or the cathode 114 are disposed over an upper surface 115 of the top portion 110B of the overhang structures 110

The base portion 110A including at least one of the TCO material or the TMO material provides allows for the base portion 110A to be exposed to an oxygen-containing plasma and remain conductive. Exposing the overhang structures 110 to the oxygen-containing plasma, i.e., oxidizing the overhang structures 110, removes organic impurities, such as a surface monolayer, that may remain on the sub-pixel circuit 100 prior to deposition of the OLED material 112. The TCO material, the TMO material, or the metal alloy material having the metal oxide surface 130 of the base portion 110A allow the overhang structures 110 to remain conductive. The conductive base portion 110A ensures permanent connection to the cathode 114.

Each sub-pixel 106 includes an encapsulation layer 116. The encapsulation layer 116 may be or may correspond to a local encapsulation layer. The encapsulation layer 116 of a respective sub-pixel is disposed over the cathode 114 (and OLED material 112) with the encapsulation layer 116 extending under at least a portion of each of the overhang structures 110. In some embodiments, as shown in FIG. 1B, which can be combined with other embodiments described herein, the encapsulation layer 116 extends along a sidewall of each of the overhang structures 110. In other embodiments, as shown in FIG. 1B, which can be combined with other embodiments described herein, the encapsulation layer 116 extends along a sidewall and is disposed on or over of the upper surface 115 of the top portion 110B each of the overhang structures 110. The encapsulation layer 116 is disposed over the cathode 114. The encapsulation layer 116 includes the non-conductive inorganic material, such as a silicon-containing material. The silicon-containing material may include $Si_3N_4$ containing materials.

In embodiments including one or more capping layers, the capping layers are disposed between the cathode 114 and the encapsulation layer 116. E.g., as shown in FIG. 1A, a first capping layer 121 and a second capping layer 123 are disposed between the cathode 114 and the encapsulation layer 116. While FIG. 1A depicts the sub-pixel circuit 100 having one or more capping layers, each of the embodiments described herein may include one or more capping layers disposed between the cathode 114 and the encapsulation layer 116. The first capping layer 121 may include an organic material. The second capping layer 123 may include an inorganic material, such as lithium fluoride. The first capping layer 121 and the second capping layer 123 may be deposited by evaporation deposition.

A global encapsulation layer 120 may be disposed over the encapsulation layer 116. A plug 122 of the third and the fourth exemplary embodiments (as depicted by the second sub-pixel 108b) may be disposed between the encapsulation layer 116 and the global encapsulation layer 120. In one example, as shown in FIG. 1A, the global encapsulation layer is conformal to the cathode 114 and the overhang structures 110. In another example, as shown in FIG. 1B, the global encapsulation layer 120 is non-conformal to the cathode 114 and the overhang structures 110. The global encapsulation layer may include an inkjet sublayer 118a and a global encapsulation sublayer 118b. The inkjet sublayer 118a may include an acrylic material.

The third and fourth exemplary embodiments (as shown depicted by the second sub-pixel of FIGS. 1A and 1B) include plugs 122 disposed over the encapsulation layers 116. Each plug 122 is disposed in a respective sub-pixel 106 of the sub-pixel circuit 100. The plugs 122 may be disposed over the upper surface 115 of the top portion 110B of the overhang structures 110. The plugs 122 include, but are not limited to, a photoresist, a color filter, or a photosensitive monomer. The plugs 122 have a plug transmittance that is matched or substantially matched to an OLED transmittance of the OLED material 112. The plugs 122 may each be the same material and match the OLED transmittance. The plugs 122 may be different materials that match the OLED transmittance of each respective sub-pixel of the plurality of sub-pixels 106. The matched or substantially matched resist transmittance and OLED transmittance allow for the plugs 122 to remain over the sub-pixels 106 without blocking the emitted light from the OLED material 112. The plugs 122 are able to remain in place and thus do not require a lift off procedure to be removed from the sub-pixel circuit 100. Additional pattern resist materials disposed over the formed sub-pixels 106 at subsequent operations are not required because the plugs 122 remain. Eliminating the need for a lift-off procedure on the plugs 122 and the need for additional pattern resist materials on the sub-pixel circuit 100 increases throughput.

Figure 1C:
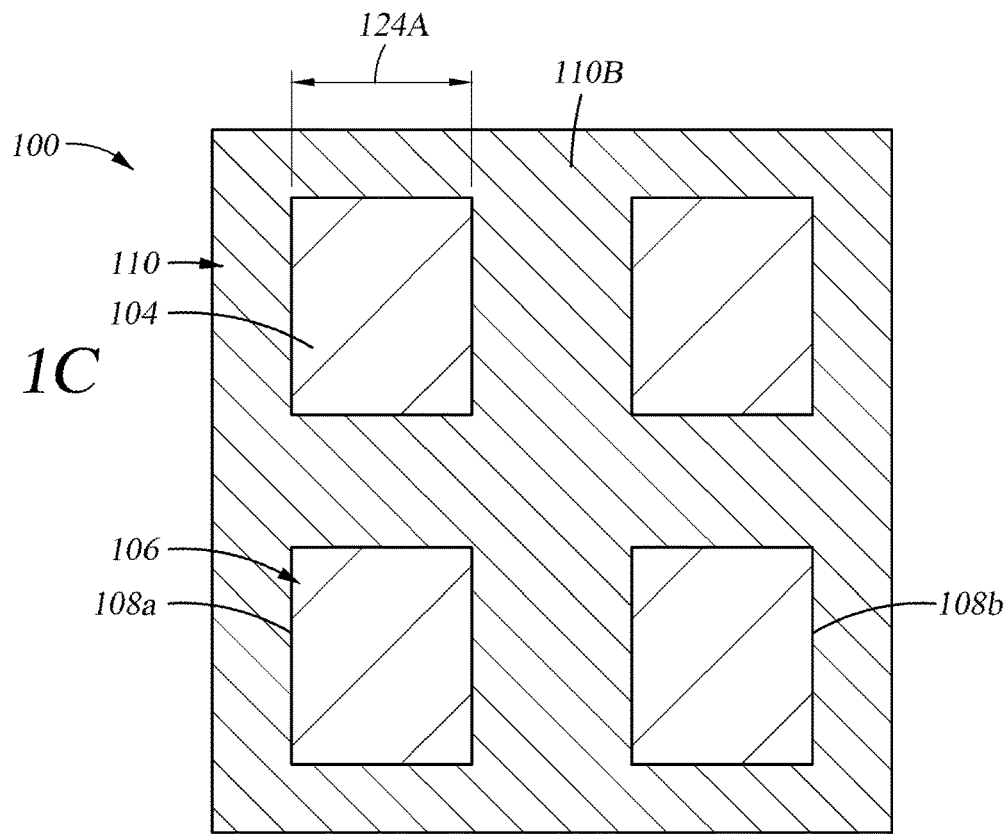
FIGS. 1C and 1D are schematic, top sectional views of a sub-pixel circuit according to embodiments.
Figure 1D:
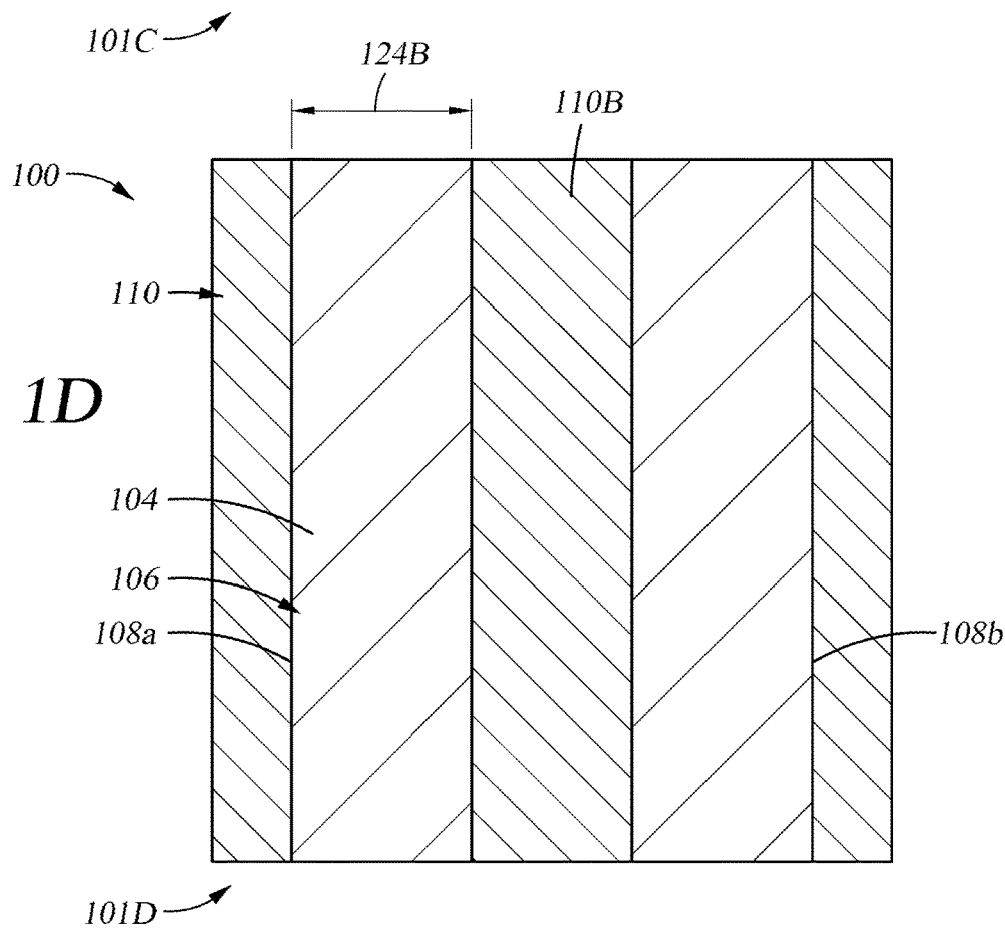

FIG. 1C is a schematic, top sectional view of a sub-pixel circuit 100 having a dot-type architecture 101C. The dot-type architecture 101C may correspond to the first or third exemplary embodiments of the sub-pixel circuit 100. FIG. 1D is a schematic, cross-sectional view of a sub-pixel circuit 100 having a line-type architecture 101D. The line-type architecture 101D may correspond to the second or fourth exemplary embodiments of the sub-pixel circuit 100. Each of the top sectional views of FIGS. 1C and 1D are taken along section line 1'-1' of FIGS. 1A and 1B.

The dot-type architecture 101C includes a plurality of pixel openings 124A. Each of pixel opening 124A is surrounded by the overhang structures 110 that define each of the sub-pixels 106 of the dot-type architecture 101C. The line-type architecture 101D includes a plurality of pixel openings 124B. Each of pixel opening 124B is abutted by overhang structures 110 that define each of the sub-pixels 106 of the line-type architecture 101D. The overhang structures 110 include a conductive oxide.

Figure 2A:
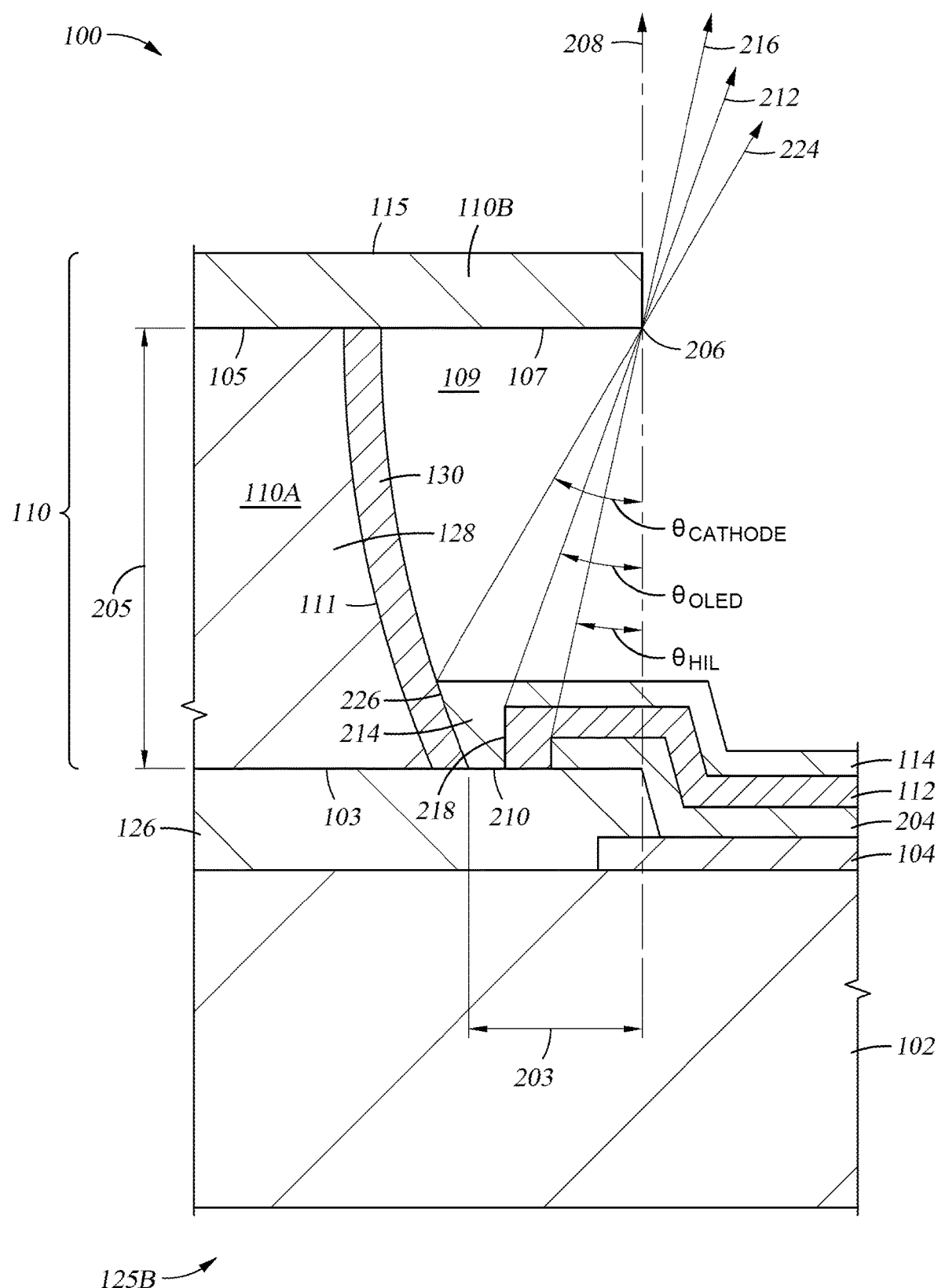
FIGS. 2A and 2B are schematic, cross-sectional views of an overhang structure according to embodiments.
Figure 2B:
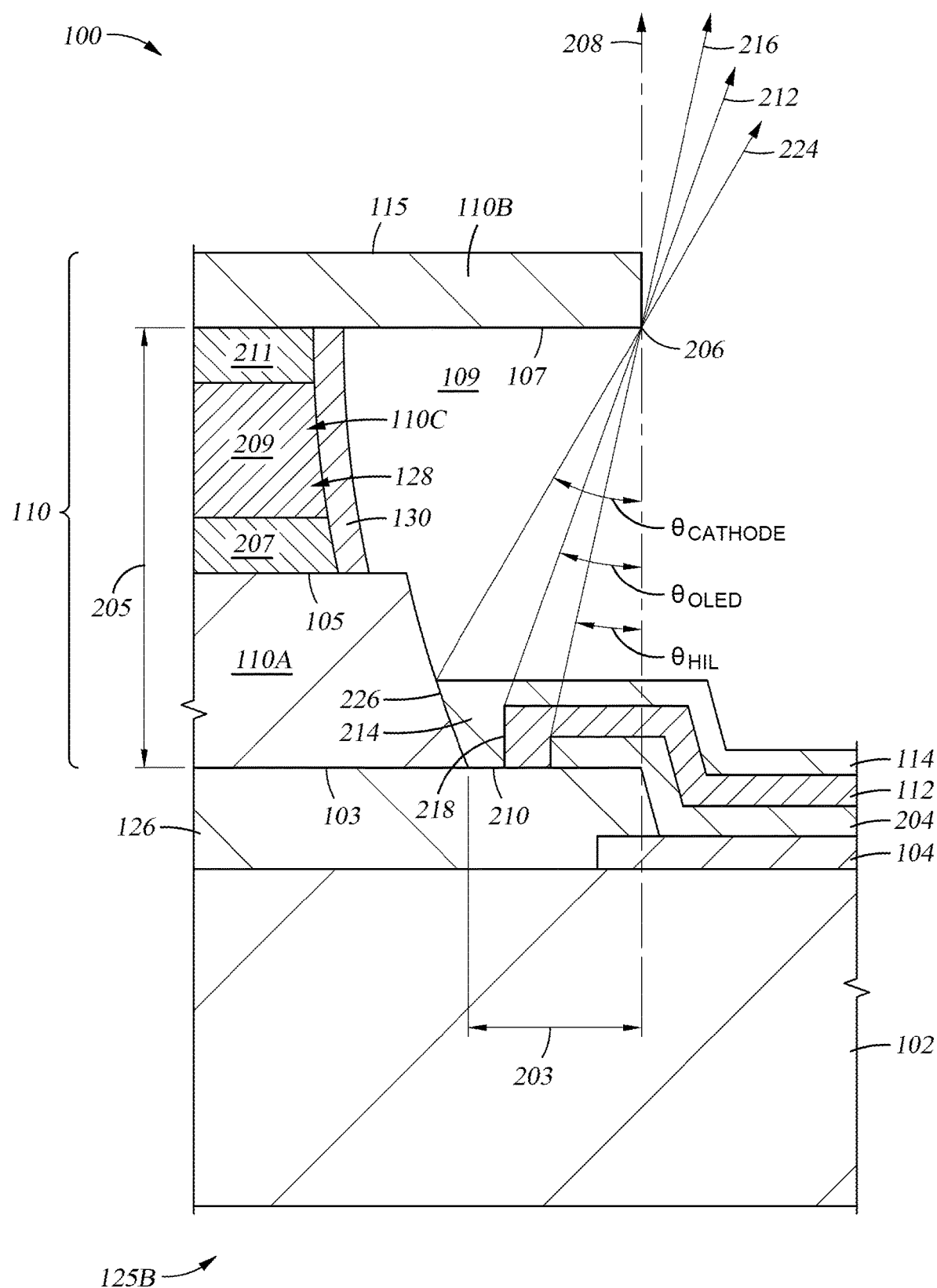

FIGS. 2A and 2B are schematic, cross-sectional view of an overhang structure 110 of a sub-pixel circuit 100 of FIGS. 1A and 1B. The overhang structure 110 of FIG. 2A includes the second sub-configuration 125B of the first configuration 101A. The base portion 110A of the overhang structure 110 of the second sub-configuration 125A includes the metal alloy material and the conductive oxide of the metal oxide surface 130. The cathode 114 contacts the metal oxide surface 130. The overhang structure 110 of FIG. 2B includes the second configuration 101B. In some embodiments, which can be combined with other embodiments described herein, as shown in FIG. 2B, the body portion 110C includes more than one metal alloy layers, such as a first metal alloy layer 207, a second metal alloy layer 209, and a third metal alloy layer 211. Each of the first metal alloy layer 207, the second metal alloy layer 209, and the third metal alloy layer 211 includes the metal alloy material that incudes, but is not limited to, Cu, Ti, Al, Mo, Ag, Sn or combinations thereof. In the embodiments, the first metal alloy layer and the third metal alloy layer 211 may be the same metal alloy material. In one example, the first metal alloy layer and the third metal alloy layer 211 include Mo and the second metal alloy layer 209 includes Ti.

The top portion 110B includes an underside edge 206 and an overhang vector 208. The underside edge 206 extends past the sidewall 111 of the base portion 110A such that the overhang structures 110 extend over a portion of the OLED material 112 and the cathode 114. The shadowing of the overhang 109 provides for evaporation deposition each of the OLED material 112 and the cathode 114, and in some embodiments, the first capping layer 121 and/or the second capping layer 123. Each overhang structure 110 includes the overhang 109 defined by an overhang width 203 and an overhang depth 205. The overhang width 203 is from the sidewall 111 of the base portion 110A to the underside edge 206, i.e., exterior edge, of the top portion 110b of the overhang structure 110. The overhang depth 205 is from PDL 126 to the underside edge 206.

The overhang vector 208 is defined by the underside edge 206 and the PDL structure 126. The OLED material 112 is disposed over the anode and over a shadow portion 210 of the PDL structure 126. The OLED material 112 forms an OLED angle $\theta_{OLED}$ between an OLED vector 212 and the overhang vector 208. The OLED vector 212 is defined by an OLED edge 214 extending under the top portion 110b. In one embodiment, which can be combined with other embodiments described herein, a HIL 204 of the OLED material 112 included. In the embodiment including the HIL 204, the OLED material 112 includes the HTL, the EML, and the ETL. The HIL 204 forms an HIL angle $\theta_{HIL}$ between a HIL vector 216 and the overhang vector 208. The HIL vector 216 is defined by an HIL edge 218 extending under the top portion 110b.

The cathode 114 is disposed on the OLED material 112 and over the shadow portion 210 of the PDL structure 126. The cathode 114 is disposed on a portion of the sidewall 111 of the base portion 110A. The cathode 114 forms a cathode angle $\theta_{cathode}$ between a cathode vector 224 and the overhang vector 208. The cathode vector 224 is defined by a cathode edge 226 at least extending under the top portion 1106. The encapsulation layer 116 is disposed over the cathode 114 (and OLED material 112) with the encapsulation layer 116 extending under at least under the top portion 1106.

During evaporation deposition of the OLED material 112, the underside edge 206 of the top portion 1106 defines the position of the OLED edge 214. E.g., the OLED material 112 is evaporated at an OLED maximum angle that corresponds to the OLED vector 212 and the underside edge 206 ensures that the OLED material 112 is not deposited past the OLED edge 214. In embodiments with the HIL 204, the underside edge 206 of the top portion 110B defines the position of the HIL edge 218. E.g., the HIL 204 is evaporated at an HIL maximum angle that corresponds to the HIL vector 216 and the underside edge 206 ensures that HIL 204 is not deposited past the HIL edge 218. During evaporation deposition of the cathode 114, the underside edge 206 of the top portion 110B defines the position of the cathode edge 226. E.g., the cathode 114 is evaporated at a cathode maximum angle that corresponds to the cathode vector 224 and the underside edge 206 ensures that the cathode 114 is not deposited past the cathode edge 226. The OLED angle $\theta_{OLED}$ is less than the cathode angle $\mu_{cathode}$. The HIL angle $\mu_{HIL}$ is less than the OLED angle $\theta_{OLED}$.

Figure 3:
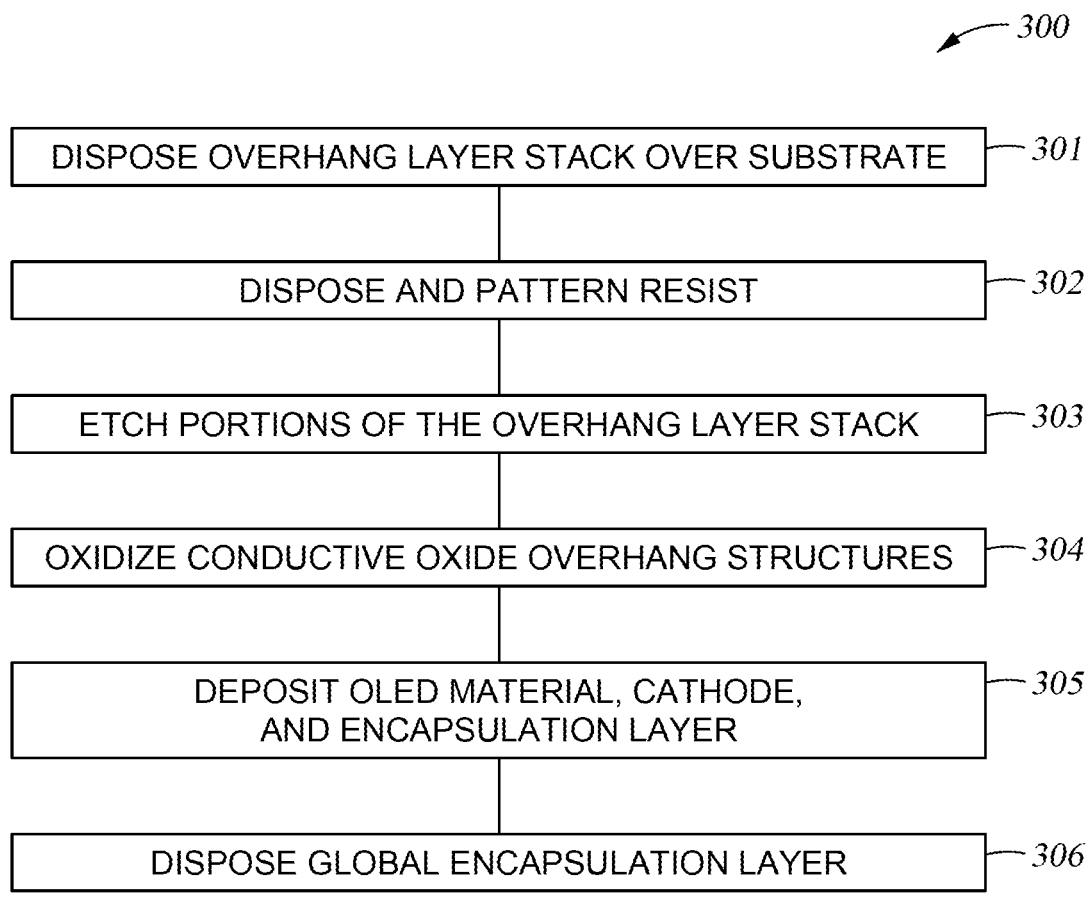
FIG. 3 is a flow a flow diagram of a method for forming a sub-pixel circuit according to embodiments.

FIG. 3 is a flow diagram of a method 300 for forming a sub-pixel circuit 100. FIGS. 4A-4H are schematic, cross-sectional views of a portion 400 of the substrate 102 during the method 300 for forming the sub-pixel circuit 100 according embodiments described herein. FIGS. 4A, 4C, 4E, and 4G depict embodiments of the method 300 for forming the sub-pixel circuit 100 having overhang structures 110 of the first configuration 101A. FIGS. 4B, 4D, 4F, and 4H depict embodiments of the method 300 for forming the sub-pixel circuit 100 having overhang structures 110 of the second configuration 101B. The method 300 may be utilized to fabricate a sub-pixel circuit 100 of one of the first, second, third, or fourth exemplary embodiments. The portion 400 corresponds to a sub-pixel 106, such as a first sub-pixel 108a, of the sub-pixel circuit 100.

Figure 4A:
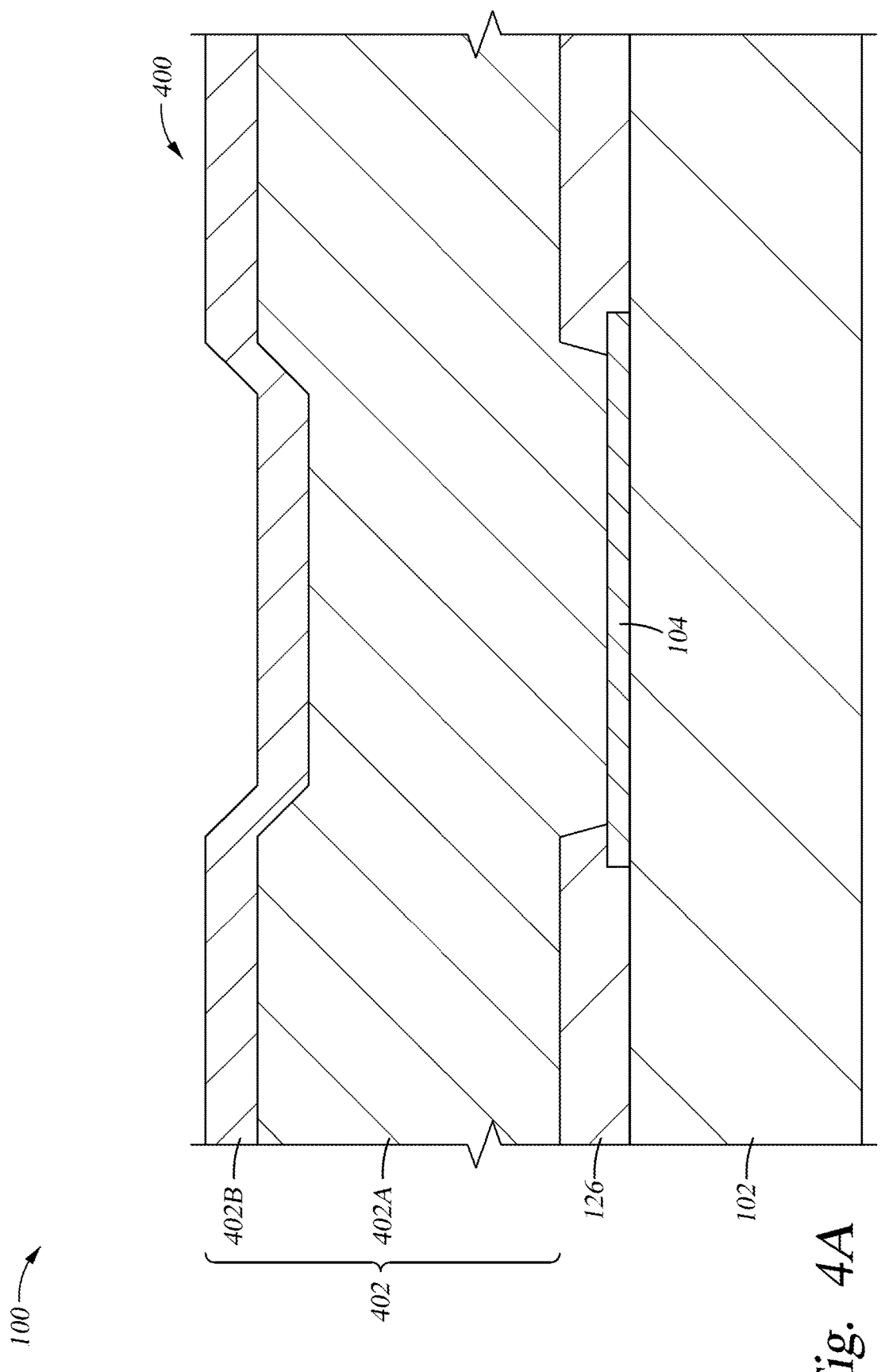
FIGS. 4A-4H are schematic, cross-sectional views of a portion of a substrate during a method for forming the sub-pixel circuit according embodiments.
Figure 4B:
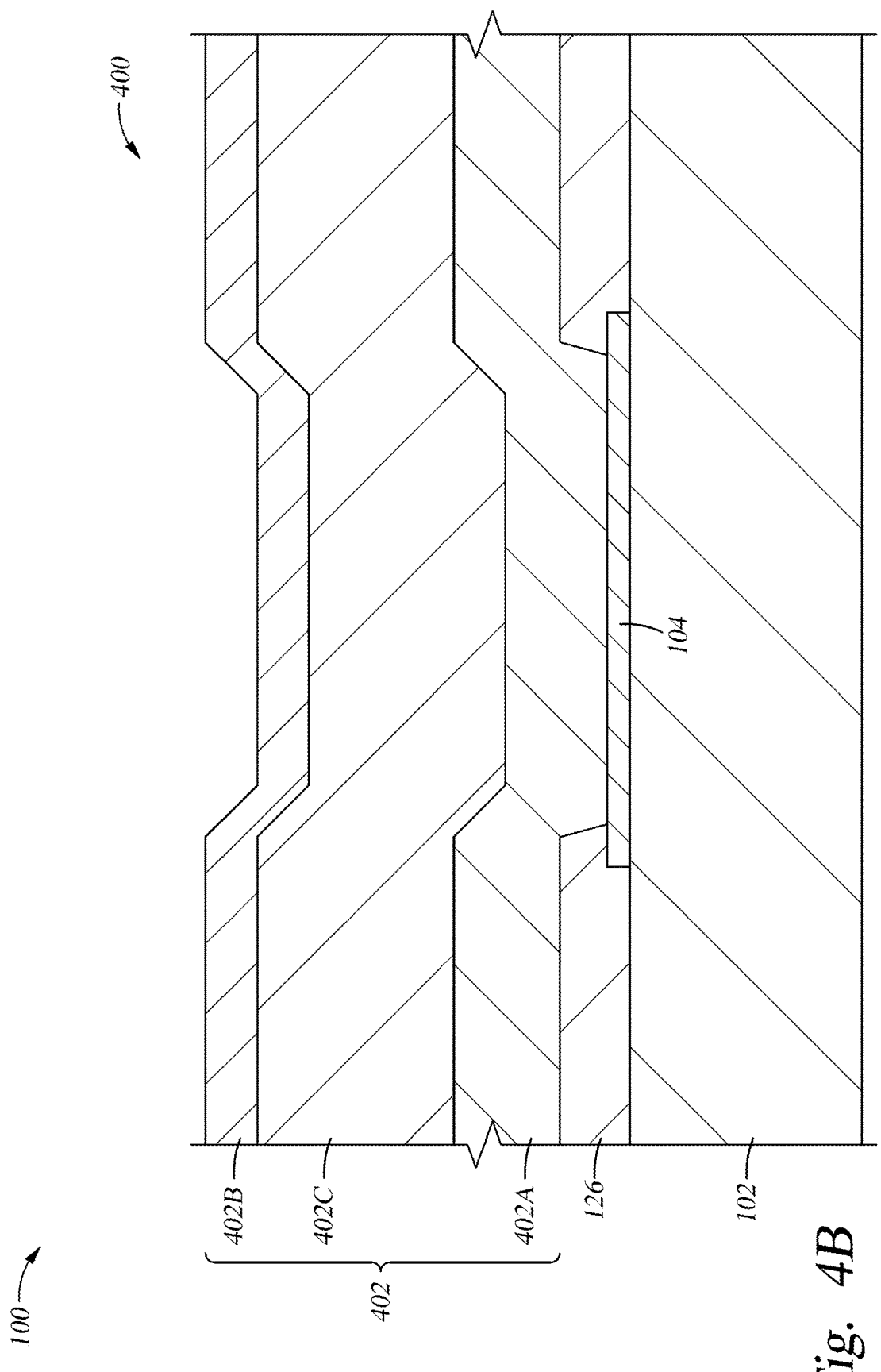

At operation 301, as shown in FIGS. 4A and 4B, an overhang layer stack 402 is disposed over the substrate 102. In embodiments of the first configuration 101A, as shown in FIG. 4A, the overhang layer stack 402 includes a base layer 402A corresponding to the base portion 110A and a top layer 402B corresponding to the top portion 110B. In embodiments of the second configuration 101B, as shown in FIG. 4B, the overhang layer stack 402 includes the base layer 402A, a body layer 402C corresponding to the body portion 110C, and the top layer 402B. The base layer 402A is disposed over the PDL structures 126 and the metal layers 104. The base layer 402A includes at least one of the TCO material or the TMO material of the first sub-configuration 125A or the metal alloy material of the second sub-configuration 125B. The body layer 402C incudes, the metal alloy material. The top layer 402B includes the metal material.

Figure 4C:
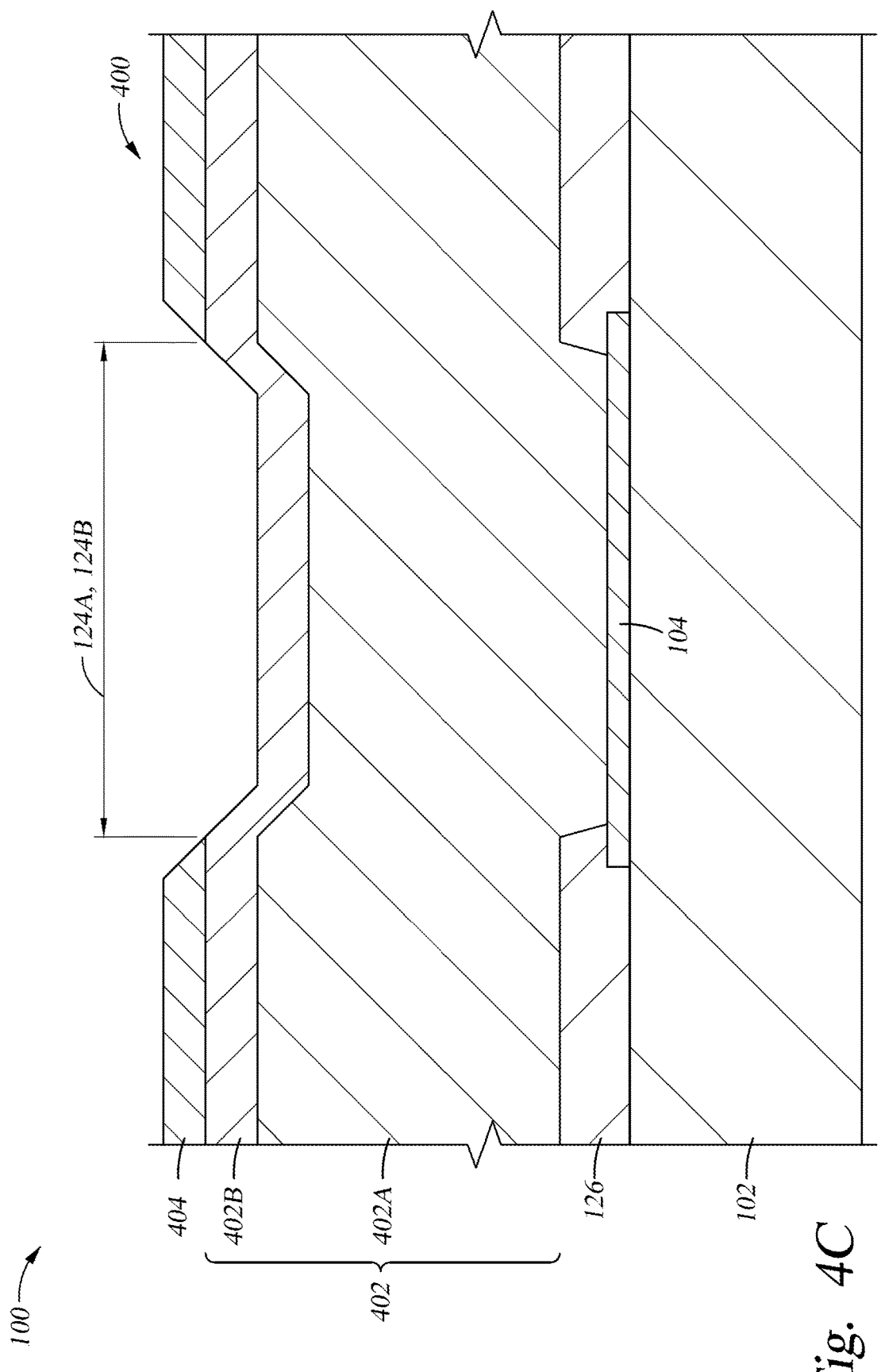
Figure 4D:
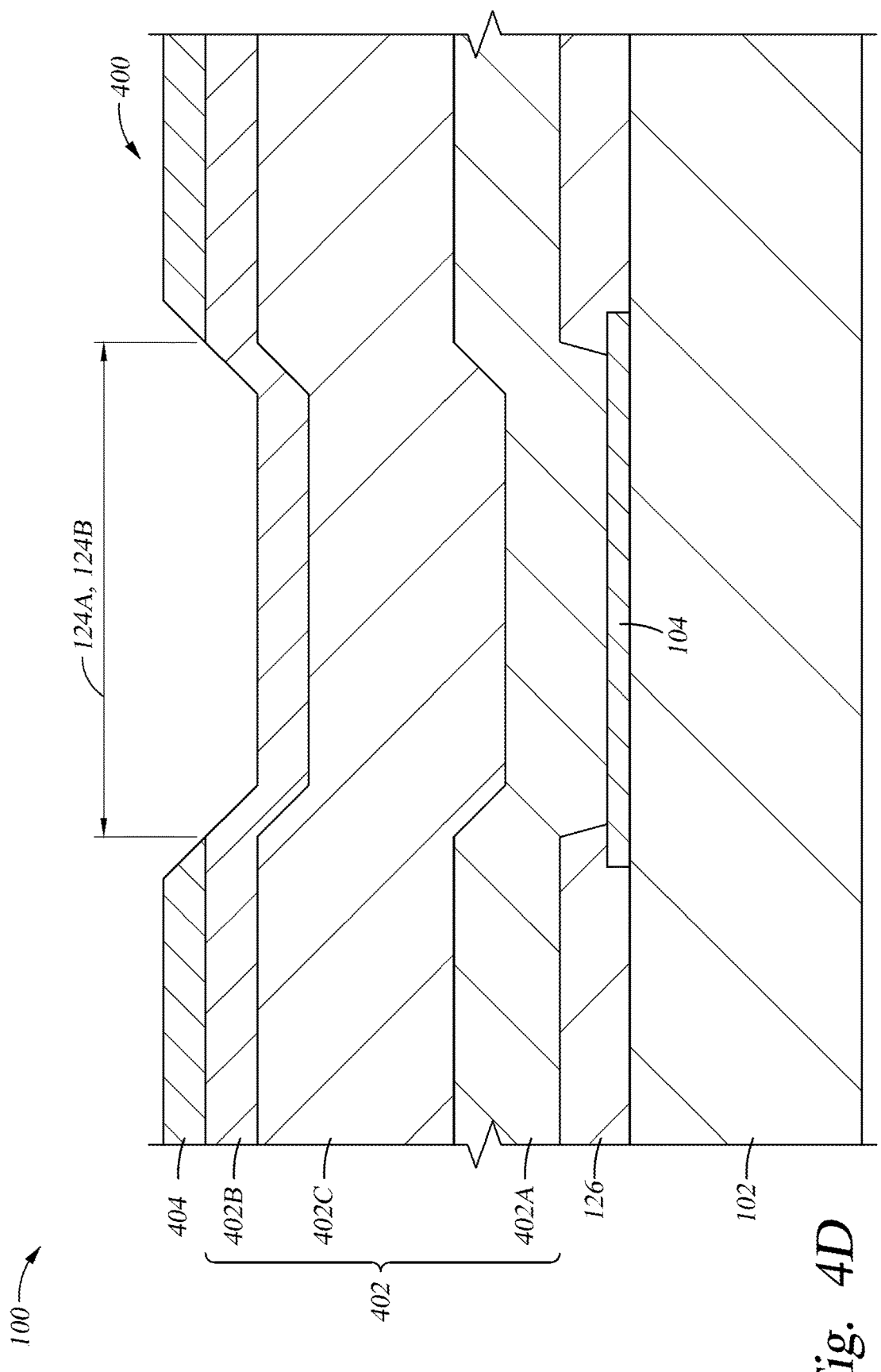

At operation 302, as shown in FIGS. 4C and 4D, a resist 404 is disposed and patterned. The resist 404 is disposed over the top layer 402B. The resist 404 is a positive resist or a negative resist. The chemical composition of the resist 404 determines whether the resist is a positive resist or a negative resist. The resist 404 is patterned to form one of a pixel opening 124A of the dot-type architecture 101C or a pixel opening 124B of the line-type architecture 101D of a sub-pixel 106. The patterning is one of a photolithography, digital lithography process, or laser ablation process.

Figure 4E:
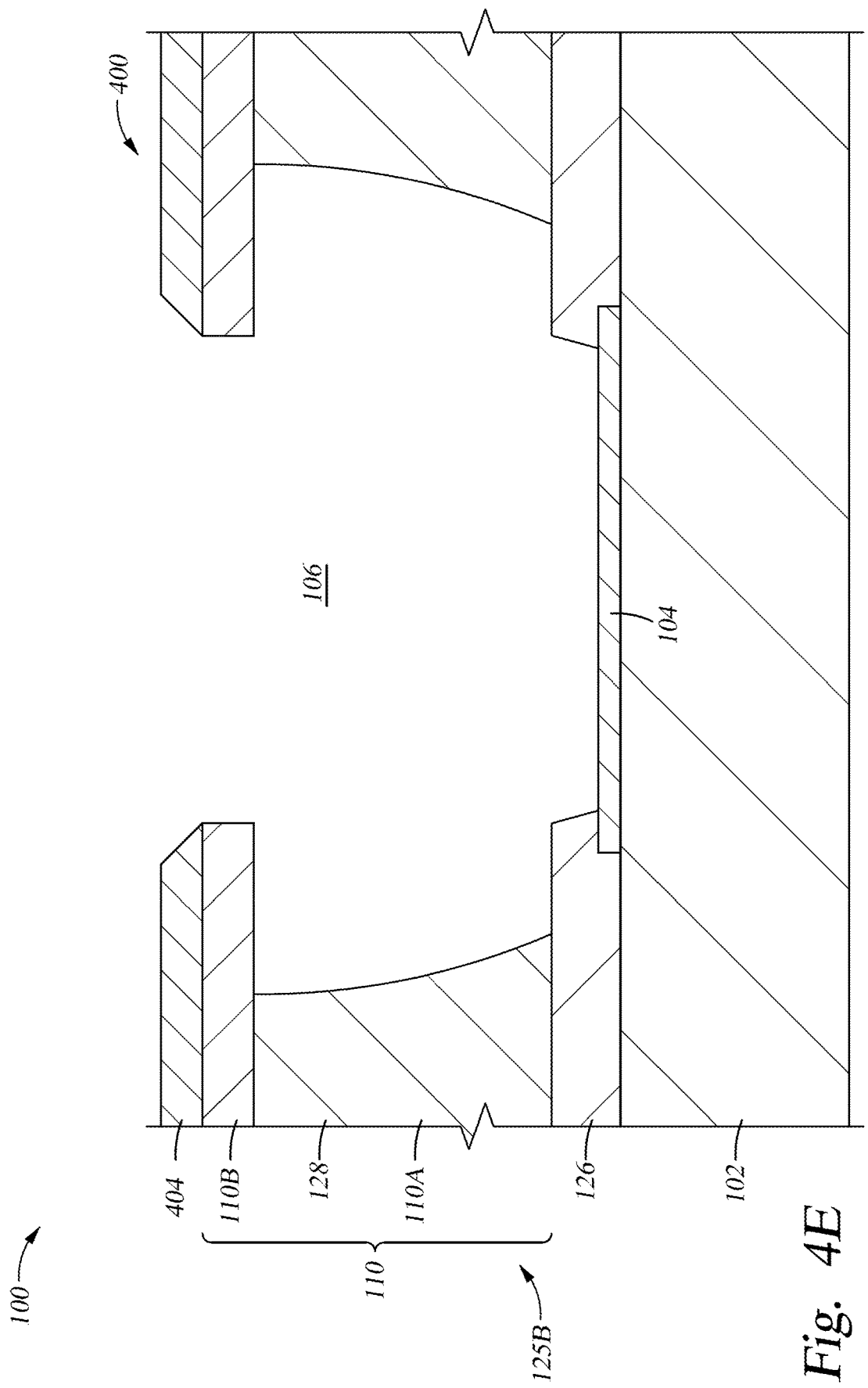
Figure 4F:
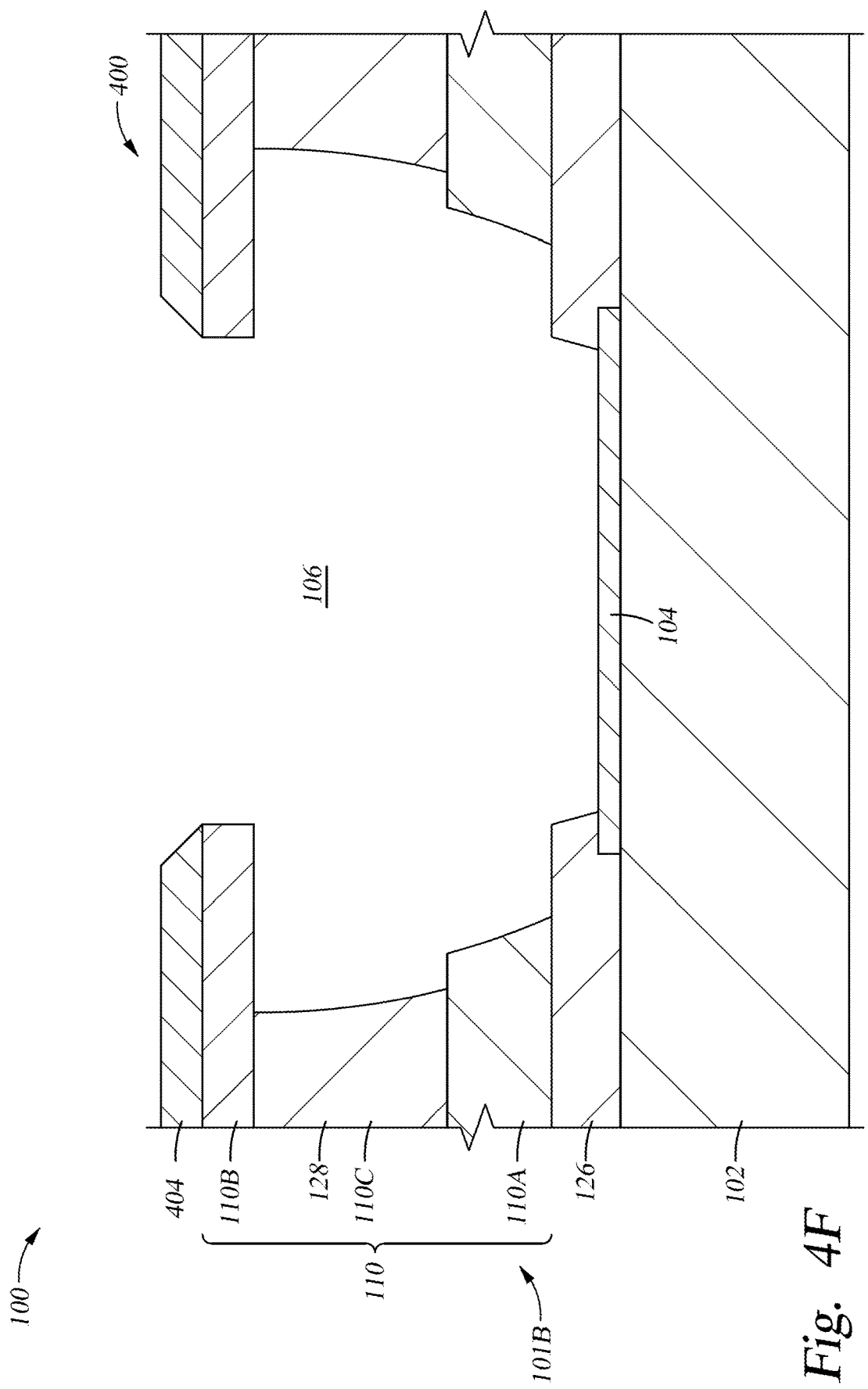

At operation 303, as shown in FIGS. 4E and 4F, portions of the overhang layer stack 402 are etched. The portions of the top layer 402B and the base layer 402A (and the body layer 402C of the second configuration 101B) exposed by the pixel opening 124A, 124B are removed with an etch process. Operation 303 forms the overhang structures 110 of the sub-pixel 106. The etch process to form the overhang structures 110 of the first configuration 101A utilizes a top layer etch chemistry and a base layer etch chemistry. The etch process to form the overhang structures 110 of the second configuration 101B utilizes the top layer etch chemistry, a body layer etch chemistry, and the base layer etch chemistry. The top layer etch chemistry includes a dry etch chemistry. The body layer etch chemistry and the base layer include a wet etch chemistry. In some embodiments, which can be combined with other embodiments described herein, the body layer etch chemistry and the base layer includes the same wet etch chemistry. The wet etch chemistry includes, but is not limited to sulfuric acid, nitric acid, and acetic acid, or combinations thereof.

In the embodiments of the first configuration 101A, to form the base portion 110A and the top portion 110B of the overhang structures 110, the top layer etch chemistry, e.g., dry etch chemistry, and the base layer etch chemistry are selected based on the compositions of the top layer 402B and the base layer 402A. The etch selectivity between the materials of the top layer 402B and the base layer 402A and the etch process to remove the exposed portions of the top layer 402B and the base layer 402A provide for an underside surface 107 of the top portion 110B being wider than a top surface 105 of the base portion 110A to form the overhang 109.

In the embodiments of the second configuration 101B, to form the base portion 110A, the body portion 110C, and the top portion 110B of the overhang structures 110, the top layer etch chemistry, e.g., dry etch chemistry, and the body layer etch chemistry and the base layer etch chemistry are selected based on the compositions of the top layer 402B, the body layer 402C, and the base layer 402A. The etch selectivity between the materials of the top layer 402B, the body layer 402C, and the base layer 402A and the etch process to remove the exposed portions of the top layer 402B and the base layer 402A provide for an underside surface 107 of the top portion 110B being wider than a top surface 105 of the base portion 110A to form the overhang 109. The wet etch chemistry will etch portions of the body layer 402C faster than base layer 402A. The shadowing of the overhang 109 provides for evaporation deposition the OLED material 112 and the cathode 114. After operation 303 the resist 404 is removed.

The TCO material and/or the TMO material of the base layer 402A allow the body layer 402C and the base layer 402A to be etched simultaneously as the TCO material and/or the TMO material will etch at a lower rate than the metal alloy material of the body layer 402C. The base layer 402A also protects the metal layers 104 from exposure to etchant when the top layer 402B, and in some embodiments, the body layer 402C are etched as a thin layer of the base layer 402A may remain after the top layer etch chemistry and the body layer etch chemistry are used. The base layer etch chemistry may be used to etch the thin, protective layer remaining from the base layer 402A. The selection of at least the TCO material and/or the TMO material of the base layer 402A, the metal material of the top layer 402B (in some embodiments the metal alloy material of the body layer 402C), and the chemistries of the etch process provide for formation of the overhang structures 110 with a uniform overhang depth 205. The overhang structures 110 of the sub-pixel circuit 100 include the overhang width 203 about 0.5 µm (micrometers) to about 1 µm. Each overhang width 203 of the overhang structures 110 are within about 15 percent of each other.

Figure 4G:
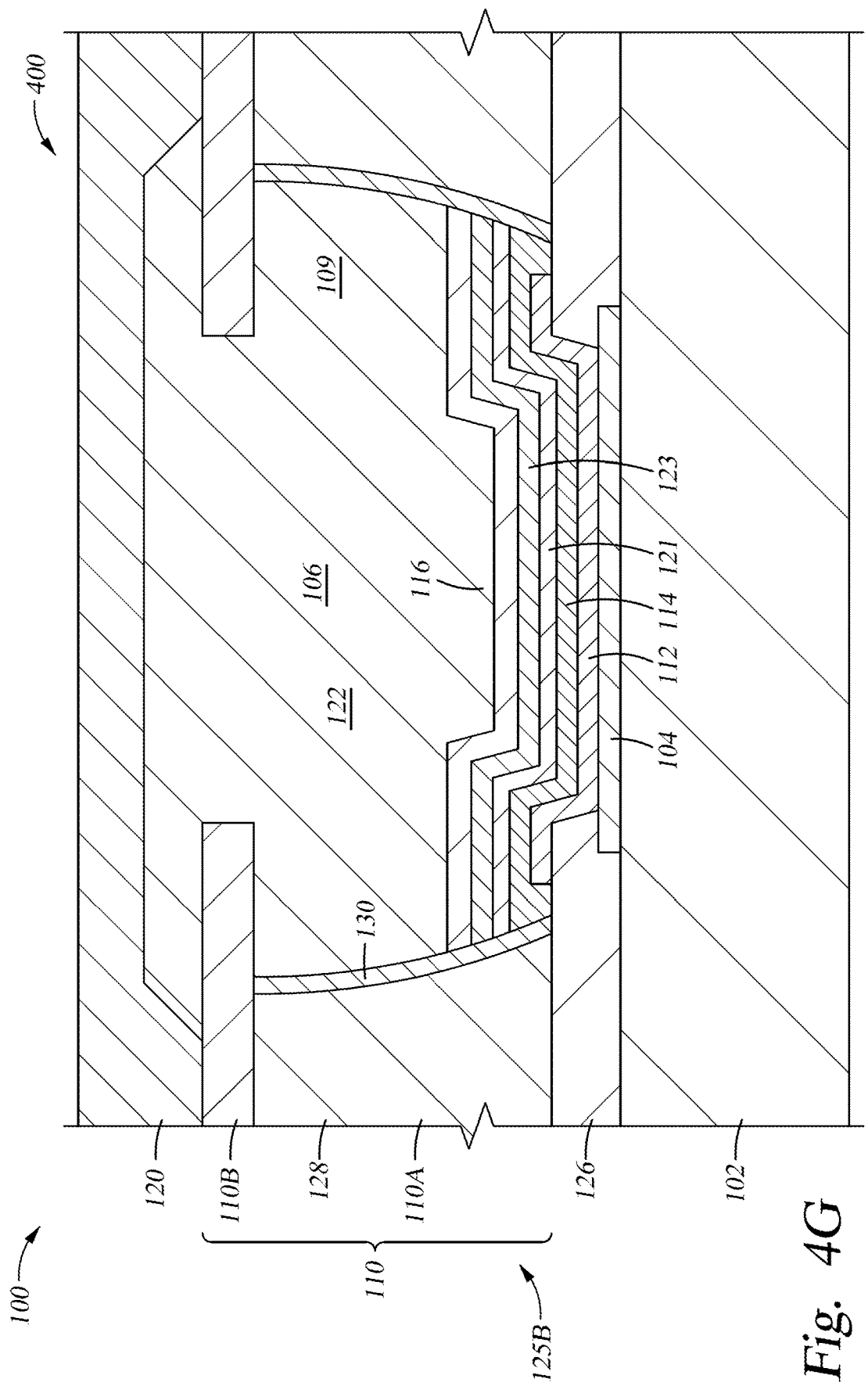
Figure 4H:
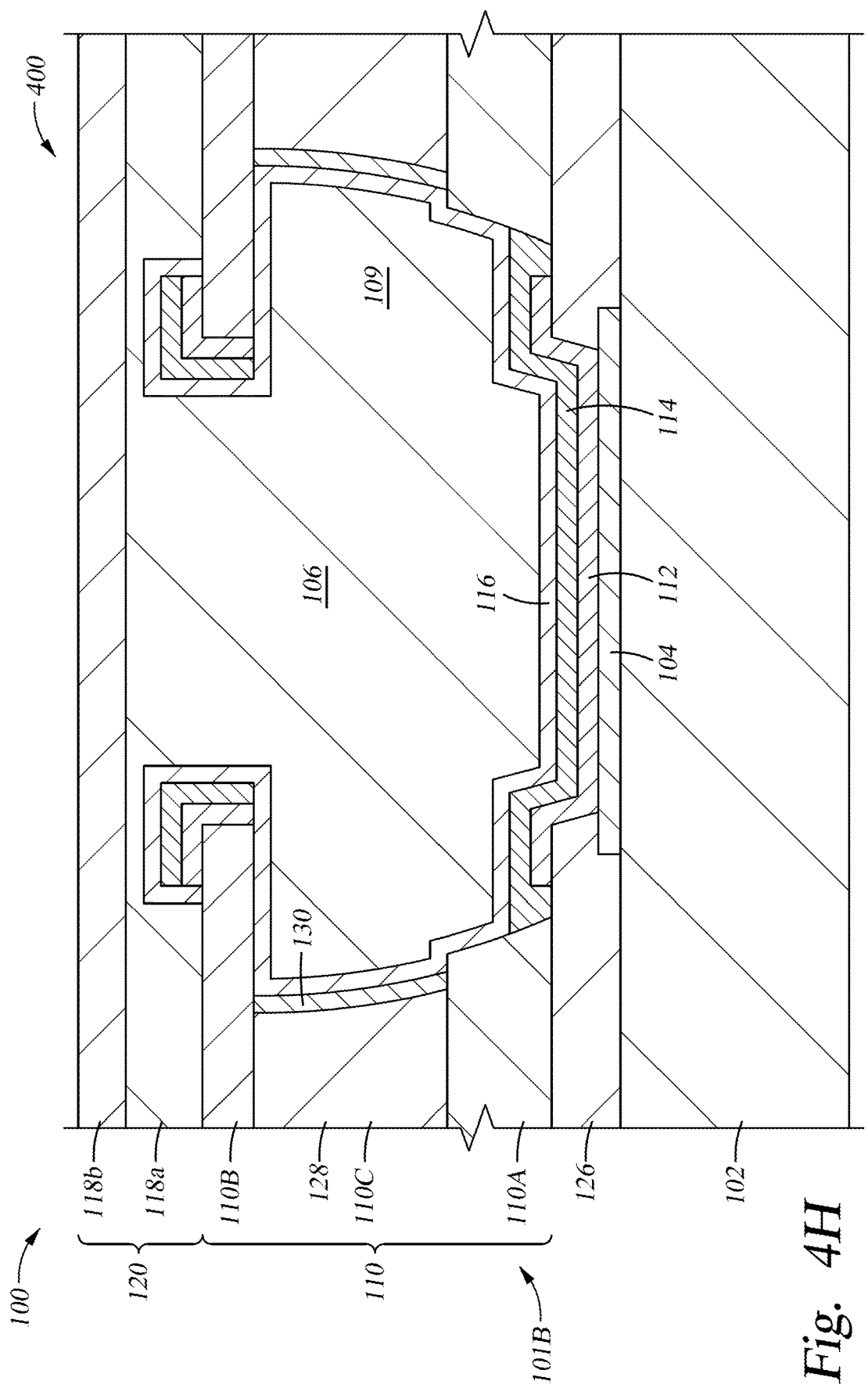

At operation 304, the overhang structures 110 are oxidized. The overhang structures 110 are oxidized via exposure to an oxygen-containing plasma, such as an O₂ plasma. In the second sub-configuration 125B of the first configuration 101A, as shown in FIGS. 2A, and 4G, exposure of the base portion 110A to an oxygen-containing plasma forms the metal oxide surface 130 on the metal alloy material. In embodiments of the second configuration 101B, as shown in FIGS. 1B, 2B, and 4H, exposure of the body portion 110C to an oxygen-containing plasma forms a metal oxide surface 130 on a metal alloy body 128 formed from operation 303. Exposing the overhang structures 110 to the oxygen-containing plasma, i.e., oxidizing the overhang structures 110, removes organic impurities, such as a surface monolayer, that may remain on the sub-pixel circuit 100 prior to deposition of the OLED material 112.

At operation 305, as shown in FIGS. 4G and 4H, the OLED material 112, the cathode 114, and the encapsulation layer 116 are deposited. The shadowing of the overhang 109 provides for evaporation deposition each of the OLED material 112 and the cathode 114. As further discussed in the corresponding description of FIGS. 2A and 2B, the shadowing effect of the overhang structures 110 define the OLED angle $\theta_{OLED}$ of the OLED material 112 and the cathode angle $\theta_{cathode}$ (of the cathode 114. The OLED angle $\theta_{OLED}$ of the OLED material 112 and the cathode angle $\theta_{cathode}$ of the cathode 114 result from evaporation deposition of the OLED material 112 and the cathode 114. In some embodiments, which can be combined with other embodiments described herein, one or more capping layer such as the first capping layer 121 and the second capping layer 123 are disposed between the cathode 114 and the encapsulation layer 116. At operation 306, a global encapsulation layer 120 is disposed. In some embodiments, as shown in FIG. 4G, the plug 122 is disposed between the encapsulation layer 116 and the global encapsulation layer 120. The global encapsulation layer 120 may include the inkjet sublayer 118a and the global encapsulation sublayer 118b.

In summation, described herein relate to sub-pixel circuits and methods of forming sub-pixel circuits that may be utilized in a display such as an organic light-emitting diode (OLED) display. The adjacent overhang structures defining each sub-pixel of the sub-pixel circuit of the display provide for formation of the sub-pixel circuit using evaporation deposition and provide for the overhang structures to remain in place after the sub-pixel circuit is formed. Evaporation deposition may be utilized for deposition of an OLED material and cathode. The overhang structures define deposition angles, i.e., provide for a shadowing effect during evaporation deposition. The base portion including at least one of the TCO material, the TMO material, or the metal alloy material having the metal oxide surface provides allows for the base portion to be exposed to an oxygen-containing plasma and remain conductive. Exposing the overhang structures to the oxygen-containing plasma, i.e., oxidizing the overhang structures, removes organic impurities, such as a surface monolayer, that may remain on the sub-pixel circuit 100 prior to deposition of the OLED material. The TCO material, the TMO material, or the metal alloy material having the metal oxide surface allows the overhang structures to remain conductive to ensure that the base portion and the cathode are permanently connected.

While the foregoing is directed to embodiments of the present disclosure, other and further embodiments of the disclosure may be devised without departing from the basic scope thereof, and the scope thereof is determined by the claims that follow.

What is claimed is:

1. A device, comprising:
   a substrate;
   pixel-defining layer (PDL) structures disposed over the substrate;
   overhang structures disposed over an upper surface of the PDL structures;
   a plurality of sub-pixels, each sub-pixel is defined by a first overhang structure and a second overhang structure adjacent to each other, the first overhang structure and the second overhang structure having:
      a base portion disposed over the upper surface a PDL structure of the PDL structures, the base portion comprising a first metal of a first composition;
      a body portion disposed over the base portion, the body portion comprising a second metal of a second composition different from the first composition; and
      a top portion disposed over the body portion, the top portion comprising a third metal of a third composition different than the first composition and the second composition, a first extension of the top portion of the first overhang structure extending laterally past first sidewalls of the base portion and the body portion, and a second extension of the top portion of the second overhang structure extending laterally past second sidewalls of the base portion and the body portion;
   each sub-pixel comprises:
      an anode;
      an organic light-emitting diode (OLED) material disposed over and in direct contact with the anode;
      a cathode disposed over the OLED material, the cathode extending under the first extension of the top portion of the first overhang structure and the second extension of the top portion of the second overhang structure, wherein the cathode directly contacts at least a sidewall of the first overhang structure; and
      an encapsulation layer disposed over the cathode, wherein the encapsulation layer extends:
         to directly contact the second metal of the second composition of the body portion;
         to directly contact the third metal of the third composition of the top portion at an underside surface of the first extension and the second extension; and
         over at least a first portion of a top surface of the first extension of the first overhang structure and the second extension of the second overhang structure of the top portion.

2. The device of claim 1, wherein the first composition comprises at least one of:
   a transition metal;
   a transition metal oxide (TMO) material; or
   a transparent conductive oxide (TCO) material.

3. The device of claim 2, wherein:
   the transition metal comprises ruthenium (Ru), vanadium (V), titanium (Ti), zinc (Zn), copper (Cu), molybdenum (Mo), or combinations thereof;
   the TMO material comprises one or more oxides of the transition metal; and
   the TCO material comprises one or more of indium zinc oxide (IZO), indium gallium zinc oxide (IGZO), indium tin oxide (ITO), or combinations thereof.

4. The device of claim 1, wherein the second composition comprises a metal alloy material.

5. The device of claim 4, wherein the metal alloy material comprises copper (Cu), titanium (Ti), aluminum (Al), molybdenum (Mo), silver (Ag), tin (Sn), or combinations thereof.

6. The device of claim 4, wherein the body portion further comprises a metal oxide surface.

7. The device of claim 6, wherein the metal oxide surface comprises one or more oxides of the metal alloy material.

8. The device of claim 1, wherein the third metal comprises Ti, Cu, Mo, ITO, IZO, or combinations thereof.

9. The device of claim 1, wherein adjacent overhangs of the overhang structures are defined by:
   an overhang width from a sidewall of the base portion to an underside edge of the top portion; and
   an overhang depth the upper surface of the PDL structure to the underside edge of the top portion.

10. The device of claim 9, wherein the overhang width of each of the overhang structures are about 0.5 μm (micrometers) to about 1 μm are within 15 percent of each other.

11. The device of claim 1, wherein the encapsulation layer extends to contact the first metal of the first composition of the base portion at a first sidewall of the base portion.

12. The device of claim 1, wherein each sub-pixel further comprises a plug disposed over the encapsulation layer, the plug having a plug transmittance that is matched or substantially matched to an OLED transmittance of the OLED material.

13. The device of claim 1, further comprising a global encapsulation layer disposed over the first overhang structure, the second overhang structure, and the encapsulation layer.

14. The device of claim 1, wherein the device comprises a dot-type architecture or a line-type architecture.

15. The device of claim 1, wherein the substrate is a pre-patterned indium tin oxide (ITO) glass substrate.

16. A device, comprising:
   a substrate;
   pixel-defining layer (PDL) structures disposed over the substrate;
   overhang structures disposed over an upper surface of the PDL structures;
   a plurality of sub-pixels, each sub-pixel is defined by a first overhang structure and a second overhang structure adjacent to each other, the first overhang structure and the second overhang structure having:
      a base portion disposed over the upper surface a PDL structure of the PDL structures, the base portion comprising a first metal of a first composition;
      a body portion disposed over the base portion, the body portion comprising a second metal of a second composition different from the first composition; and
      a top portion disposed over the body portion, the top portion comprising a third metal of a third composition different than the first composition and the second composition, a first extension of the top portion of the first overhang structure extending laterally past first sidewalls of the body portion, and a second extension of the top portion of the second overhang structure extending laterally past second sidewalls of the body portion;
   each sub-pixel comprises:
      an anode;
      an organic light-emitting diode (OLED) material disposed over and in direct contact with the anode;
      a cathode disposed over the OLED material, the cathode extending under the first extension of the top portion of the first overhang structure and the second extension of the top portion of the second overhang structure, wherein the cathode directly contacts at least a sidewall of the first overhang structure; and
      an encapsulation layer disposed over the cathode, wherein the encapsulation layer extends:
         to directly contact the second metal of the second composition of the body portion;
         to directly contact the third metal of the third composition of the top portion at an underside surface of the first extension and the second extension; and
         over at least a first portion of a top surface of the first extension of the first overhang structure and the second extension of the second overhang structure of the top portion.

17. The device of claim 16, wherein the second composition comprises a metal alloy material.

18. The device of claim 17, wherein the body portion further comprises a metal oxide surface.

19. The device of claim 18, wherein the metal oxide surface comprises one or more oxides of the metal alloy material.

20. The device of claim 16, wherein the first composition comprises at least one of:
   a transition metal;
   a transition metal oxide (TMO) material; or
   a transparent conductive oxide (TCO) material.

21. A device, comprising:
   a substrate;
   pixel-defining layer (PDL) structures disposed over the substrate;
   overhang structures disposed over an upper surface of the PDL structures;
   a plurality of sub-pixels, each sub-pixel is defined by a first overhang structure and a second overhang structure adjacent to each other, the first overhang structure and the second overhang structure having:
      a base portion disposed over the upper surface a PDL structure of the PDL structures, the base portion comprising a first metal of a first composition;
      a body portion disposed over the base portion, the body portion comprising a second metal of a second composition different from the first composition; and
      a top portion disposed over the body portion, the top portion comprising a third metal of a third composition different than the first composition and the second composition, a first extension of the top portion of the first overhang structure extending laterally past first sidewalls of the body portion, and a second extension of the top portion of the second overhang structure extending laterally past second sidewalls of the body portion;
   each sub-pixel comprises:
      an anode;
      an organic light-emitting diode (OLED) material disposed over and in direct contact with the anode;
      a cathode disposed over the OLED material, the cathode extending under the first extension of the top portion of the first overhang structure and the second extension of the top portion of the second overhang structure, wherein the cathode directly contacts at least a sidewall of the first overhang structure; and
      an encapsulation layer disposed over the cathode, wherein the encapsulation layer extends:

to directly contact the second metal of the second composition of the body portion; and to directly contact the third metal of the third composition of the top portion at an underside surface of the first extension and the second extension.

22. The device of claim 21, wherein the second composition comprises a metal alloy material.

23. The device of claim 22, wherein the body portion further comprises a metal oxide surface.

24. The device of claim 23, wherein the metal oxide surface comprises one or more oxides of the metal alloy material.

25. The device of claim 24, wherein the first composition comprises at least one of:

a transition metal;

a transition metal oxide (TMO) material; or a transparent conductive oxide (TCO) material.

* * * * *